United States Patent [19]

Khajezadeh et al.

[11] 4,057,894
[45] Nov. 15, 1977

[54] CONTROLLABLY VALUED RESISTOR

[75] Inventors: Heshmat Khajezadeh, Somerville; Stephen Carl Ahrens, Delran, both of N.J.

[73] Assignee: RCA Corporation, New York, N.Y.

[21] Appl. No.: 656,295

[22] Filed: Feb. 9, 1976

[51] Int. Cl.$^2$ .................................. B01J 17/00
[52] U.S. Cl. .................... 29/577 C; 29/576 C; 29/610 R; 338/195; 357/51
[58] Field of Search ........... 29/576 DC, 577, 578, 29/610; 357/51; 338/195

[56] References Cited

U.S. PATENT DOCUMENTS

| 3,673,428 | 6/1972 | Athanas | 357/51 |
| 3,761,786 | 9/1973 | Imaizumi | 357/51 |
| 3,922,707 | 11/1975 | Freed | 357/51 |

Primary Examiner—W. Tupman
Attorney, Agent, or Firm—H. Christoffersen; T. H. Magee

[57] ABSTRACT

A monolithic semiconductor device including a resistor comprising a first region of one type conductivity, has means for controllably establishing the value of the resistor comprising two additional regions of the opposite type conductivity disposed respectively on opposite sides of the conductive path of the resistor, whereby the width of the resistor is defined by the extent of the additional regions into the first region. Where the monolithic semiconductor device comprises an integrated circuit device including a lateral transistor, the additional regions may be formed simultaneously with the emitter and collector regions of the transistor while utilizing the same doping mask, whereby any variation in the base width of the transistor is made proportional to the variation in the width of the resistor. Such a resistor has a value proportional to the beta of the transistor and may be utilized with circuit means for connecting the resistor with the transistor to compensate for a variation in the base width of the transistor.

5 Claims, 9 Drawing Figures

CONTROLLABLY VALUED RESISTOR

This invention relates to a monolithic semiconductor device, including a resistor, having means therein for controllably establishing the value of the resistor. The invention also includes a method of making the value of the resistor proportional to the beta of a lateral transistor disposed in the semiconductor device.

In making a monolithic integrated circuit device including a lateral transistor, a diffusion process is generally used to form the emitter and collector regions of the transistor. The base width of such a lateral transistor, as measured by the distance between the emitter and collector regions thereof, is determined in part by the extent of the diffusion process, which may vary from one semiconductor wafer to the next wafer due to the inability to precisely control the masking and diffusion processes. Consequently, the base widths of lateral transistors may vary, not only in different wafers but also in different portions of the same wafer. Since the beta (the collector-to-base current gain in a grounded-emitter transistor, equal to alpha divided by one minus alpha, where alpha is the collector-to-emitter current gain) of a transistor is a function of base width, the betas of such lateral transistors may also vary causing undesirable differences in the base currents and other operating characteristics of such transistors. A resistor may be utilized to compensate for a difference in the beta of a transistor. However, it is difficult to readily provide resistors having values which will effectively compensate for the differences in the betas of such lateral transistors, especially when the betas may vary differently from one lateral transistor to the next lateral transistor.

Other types of semiconductor resistors used in combination with CMOS integrated circuit devices have been utilized to form portions of diodes having low breakdown voltages (see U.S. Pat. No. 3,673,428 issued to Terry G. Athanas on June 27, 1972); however, such resistors are structurally different from the controllably valued resistors of the present invention, and are not capable of being effectively utilized to compensate for differences in the betas of lateral transistors. Although resistors have been utilized in integrated circuit devices as self-compensating structures for limiting base drive current through vertical transistors (see U.S. Pat. No. 3,465,213 issued to Frances B. Hugle on Sept. 2, 1969), such resistors are capable of being effectively utilized only in combination with vertical transistors, and not lateral transistors. Also, the width of such a resistor and the width of the base of the associated vertical transistor are exactly the same by virtue of the manner in which they are formed. In the present invention, it is not necessary that the width of the resistor and the base width of the associated lateral transistor be the same.

Figure 1:
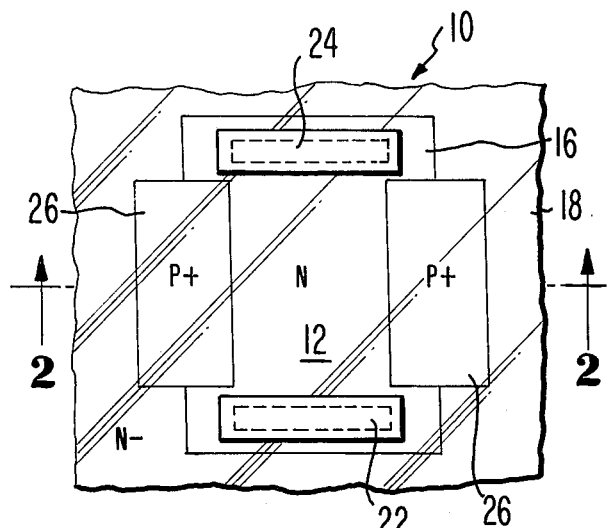
FIG. 1 is a plan view showing the preferred embodiment of the present novel semiconductor device.
Figure 2:
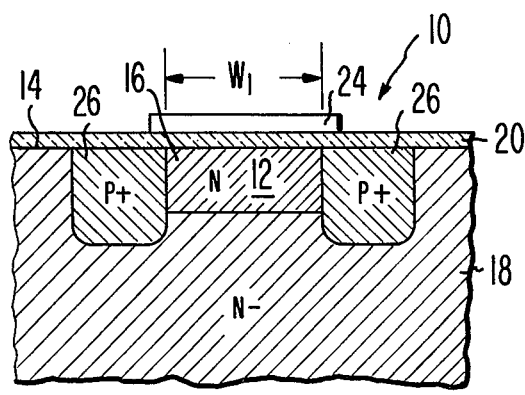
FIG. 2 is a cross-sectional view taken along line 2—2 of FIG. 1.

Referring to FIGS. 1 and 2 of the drawings, there is shown a monolithic semiconductor device 10 having a resistor 12 disposed adjacent to a planar surface 14 of the device 10. The resistor 12 comprises a first region 16 of one type conductivity, N type in the present example, disposed in a second region 18 of the same type conductivity. The second region 18 has a lower impurity concentration than the first region 16 and is typically a portion of a semiconductor wafer such as, for example, a silicon wafer. By having the first region 16 more-heavily-doped than the second region 18, the conductive path of the resistor 12 is primarily contained within the first region 16 which then determines the sheet resistivity of the resistor 12. A typical concentration of conductivity modifiers in the first region 16 may be about $10^{18}$ atoms per cubic centimeter when the concentration in the second region 18 is about $10^{15}$ atoms per cubic centimeter.

The device 10 shows in FIGS. 1 and 2 also comprises a protective layer of silicon dioxide 20 disposed adjacent to the surface 14 thereof, and a first and a second ohmic contact 22 and 24 respectively, for making contact to the resistor 12 at opposite ends of the first region 16 and thus defining the ends of a conductive path through the resistor 12.

The semiconductor device 10 further includes means for controllably establishing the value of the resistor 12 comprising two additional regions 26 of the opposite type conductivity, P+ type in the present example, disposed respectively on opposite sides of the first region 16 and adjacent to both the surface 14 and the junction between the first and second regions 16 and 18, as shown in FIGS. 1 and 2. The additional regions 26 have a greater depth than the first region 16 and extend into the first region 16, whereby the width $W_1$ of the resistor 12, as measured along the perpendicular to the N type conductive path at various locations along the conductive path, is defined by the extent of the additional regions 26 into the first region 16. In order that the additional regions 26 may extend into the first region 16 and thereby control the width $W_1$ of the conductive path, the additional regions 26 must have a higher impurity concentration than the first region 16 such as, in the present example, about $10^{19}$ atoms per cubic centimeter. By making the depth of the additional regions 26 greater than the depth of the first region 16, such additional regions may determine the width $W_1$ of the resistor 12 at all depths of the conductive path. As a result, the additional regions 26 control the sheet resistivity of the resistor 12 at all depths thereof and thereby effectively establish the overall value of the resistor 12.

Figure 3:
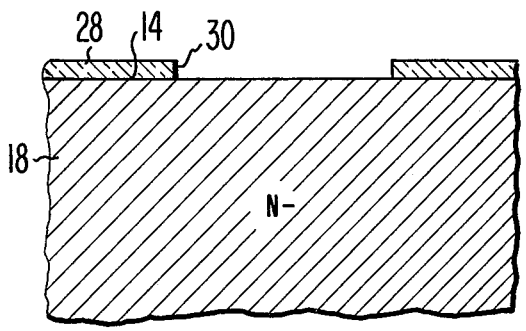
FIGS. 3–6 are a series of cross-sectional views showing a succession of steps in the manufacture of the present novel device.

Referring to FIGS. 3–6, there is shown a succession of steps illustrating a method for making the present novel device 10. In FIG. 3, there is shown a substrate, such as a silicon wafer, which has an extrinsic conductivity of one type, N− type shown here, and comprises the aforementioned second region 18. A layer 28 of material to be used as a diffusion mask is formed on the surface 14 of the second region 18. Such a layer 28 may be made of silicon dioxide which either can be deposited on the surface 14 by chemically reacting a gaseous silane such as silicon tetrahydride with oxygen in the presence of an inert gas such as nitrogen, or can be thermally grown at the surface 14 by heating the substrate in an oxidizing atmosphere, such as steam, to a temperature at which a portion of the second region 18 is thermally oxidized, such as, for example, about 900° C. A window 30 is etched in this layer 28 by using known photolithographic techniques exposing a portion of the surface 14 beneath which the first region 16 is to be formed.

Figure 4:
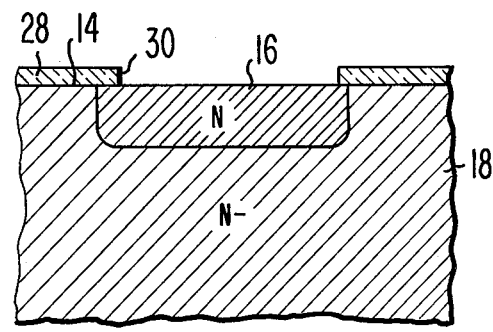
Figure 5:
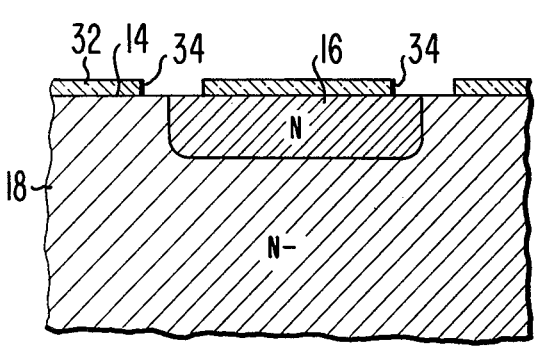
Figure 6:
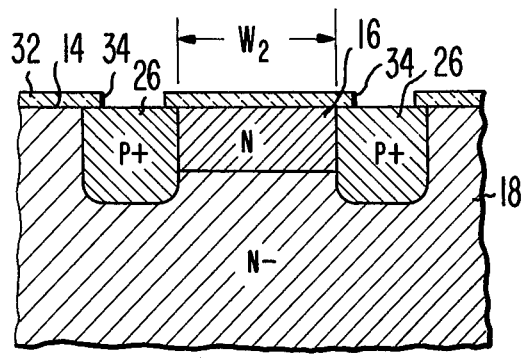

Referring to FIG. 4, the first region 16 may be formed by selectively diffusing dopant impurities, N type in the present example, through the window 30, in a diffusion furnace. After removal of the layer 28 and any other oxides which may be grown during the diffusion step, a second layer 32 of masking material is then formed on the surface 14 and windows 34 are etched therein, as shown in FIG. 5, using the aforementioned techniques. Using this second layer 32 as a diffusion mask, the additional regions 26 are now formed by selectively diffusing dopant impurities, P type in the present example, through the windows 34, in a diffusion furnace, as shown in FIG. 6. Although the first region 16 and the additional regions 26 are formed in a diffusion furnace in the present example, any other method for introducing dopant impurities into the second region 18 may be used such as, for example, ion implantation followed by a drive-in diffusion.

Figures 7, 8, 9:
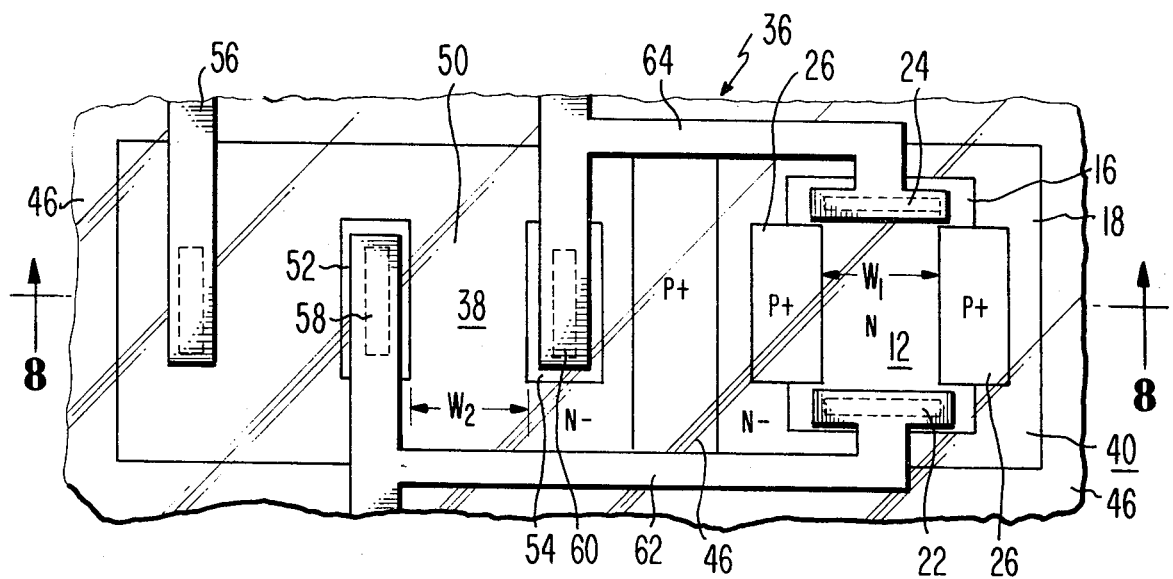
FIG. 7 is a plan view showing one embodiment of an integrated circuit device, including a lateral transistor, utilizing the present novel invention.
FIG. 8 is a cross-sectional view taken along line 8—8 of FIG. 7.
FIG. 9 is a circuit diagram for the integrated circuit device of FIGS. 7 and 8.

Referring to FIGS. 7 and 8, there is shown a monolithic integrated circuit device 36 comprising both a lateral transistor 38 and the above-described resistor 12 which has a value proportional to the beta of the lateral transistor 38. In one embodiment of the integrated circuit device 36, the second region 18 may be a junction-isolated region disposed in a body of semiconductive material of the opposite type conductivity. Such a region 18 is typically part of an epitaxial layer 40 disposed on the upper boundary 42 of a substrate 44 of the opposite type conductivity, P— type in the present example. More-heavily-doped isolation regions 46 extend through the epitaxial layer 40 from the surface 48 thereof to the boundary 42 of the substrate 44 to separate the layer 40 into a plurality of junction-isolated regions, including not only the second region 18 but also a region 50 which will be the base region of the lateral transistor 38.

The lateral transistor 38 has spaced emitter and collector regions 52 and 54 respectively of the opposite type conductivity, P+ type in the present example, which are formed in a manner similar to and simultaneously with the additional regions 26 while utilizing the same doping mask. The same doping mask is used in order to take into account any variations which might be caused by the photolithographic techniques used to form the windows in the mask. Since the additional regions 26 and the emitter and collector regions 52 and 54 are defined at the same masking step, the width $W_1$ of the resistor 12 and the width $W_2$ of the lateral transistor 38, as measured by the distance between the emitter and collector regions 52 and 54, will directly track one another, and any variation in the width $W_1$ of the resistor 12 is made proportional to the variation in the base width $W_2$ of the transistor 38. Although the first region 16 of the resistor 12 is more-heavily-doped than the base region 50 of the lateral transistor 38, which may vary the extent of any diffusion therein, any variations in the widths $W_1$ and $W_2$ are still proportional to each other, and may even be equal in percentage since it is not necessary that the width $W_1$ of the resistor 12 be equal in distance to the base width $W_2$ of the transistor 38. The lateral transistor 38 has base, emitter, and collector contact electrodes 56, 58, and 60 to electrically contact respectively the base, emitter and collector regions 50, 52, and 54 of the transistor 38.

The monolithic integrated circuit device 36 further comprises circuit means electrically connected to the first and second ohmic contacts 22 and 24 of the resistor 12 and the base, emitter, and collector electrodes 56, 58, and 60 of the transistor 38 for connecting the resistor 12 with the transistor 38 to compensate for a variation in the base width $W_2$ of the transistor 38. In the present embodiment, the circuit means comprises a first conductor 62 connecting the first ohmic contact 22 to the emitter contact electrode 58, and a second conductor 64 connecting the second ohmic contact 24 to the collector contact electrode 60. The first and second conductors 62 and 64 are formed using conventional metalization techniques above a protective insulating layer 66 such as, for example, a layer of silicon dioxide, which is disposed adjacent to the surface 48 of the epitaxial layer 40. The circuit means utilized in the present embodiment, shown in FIGS. 7 and 8, is illustrated in the corresponding circuit diagram of FIG. 9. Although the circuit diagram shown in FIG. 9 is basic in concept, the circuit means which is utilized for connecting the resistor 12 with the transistor 38 may comprise any circuit configuration which utilizes the resistor 12 to compensate for a variation in the base width $W_2$ of the transistor 38.

The present novel resistor 12 has a value inversely proportional to the base width $W_2$ of the lateral transistor 38, since any variation in the width $W_1$ of the resistor 12, which is a factor in determining the cross-sectional area of the resistor 12, is proportional to the variation in the base width $W_2$ of the transistor 38. As a result, the value of the resistor 12 is proportional to the beta of the transistor 38 since the beta of the transistor 38 is a function of base width $W_2$.

The essence of the present invention's novelty comprises the cooperative use of the additional regions 26 in combination with the more-heavily-doped region 16. As mentioned above, resistors and transistors in integrated circuit devices are typically formed in junction-isolated regions which are portions of the same epitaxial layer. In forming a vertical transistor in such a junction-isolated region, a base region is initially formed in the junction-isolated region, and then an emitter region is formed in the base region. Consequently, one may conveniently use as a resistor in a separate junction-isolated region, a region formed in a similar manner by the same two diffusion process which created the base and emitter regions of the vertical transistor, since the conductive path of the resistor may be contained within the explicitly defined base region and the width of the resistor at certain locations along this conductive path may be adjusted during the formation of the emitter region. Such a structure is described in the aforementioned Hugle patent. However, in forming a lateral transistor 38, an explicitly defined base region of conductivity type opposite to that of the epitaxial layer is not formed within the junction-isolated region; only the emitter and collector regions are formed in this junction-isolated region which serves as the base region. Consequently, there is no region present which may conveniently serve as a controllably valued resistor within the junction-isolated region. The present novel semiconductor device 10 overcomes this problem by utilizing for the resistor 12 a more-heavily-doped region 16 of the same type conductivity as the epitaxial layer 40 formed in the junction-isolated region 18, whereby the conductive path of the resistor 12 is now contained within the more-heavily-doped region 16. Although the use of the more-heavily-doped region 16 for the resistor 12 may appear to be unorthodox in view of customary procedures in the art, such a concentration of conductivity modifiers for the region 16 is described relative to the background concentration of the junction-isolated region 18, and concentrations similar to the aforementioned examples are practical operating levels for the resistor 12. It is precisely this unorthodox approach of the present invention in combination with the additional regions 26 which enables the value of the novel resistor 12 to be controllably established. By utilizing the more-heavily-doped region 16, the two additional regions 26 in combination therewith may thereby effectively establish the width $W_1$ of the resistor 12, and thus allow the resistor 12 to have a value proportional to the beta of the lateral transistor 38.

The importance of having such a monolithic integrated circuit resistor 12 whose value is proportional to the beta of the lateral transistor 38 is that the resistor 12 can then be used in circuits such as, for example, the circuit shown in FIG. 9 to roughly compensate for wide variations in the beta of the lateral transistor 38. In this circuit, if the value R of the resistor 12 remained constant and beta increased, the base current $I_B$ would decrease proportionately. However, if the value R of the resistor 12 increased as beta increased, the emitter current would decrease and the base current $I_B$ would remain relatively constant. Consequently, such a resistor 12 may be utilized along with the lateral transistor 38, which is typically adjacent thereto and on the same semiconductor wafer, to automatically compensate for any variation in the beta of the lateral transistor 38. The present invention may therefore be utilized in situations where the betas of a plurality of lateral transistors may vary differently from one transistor to the next transistor, and thereby achieve lateral transistors having similar base currents when subjected to identical operating potentials.

What is claimed is:

1. In a method of making a monolithic semiconductor device having a resistor disposed adjacent to a planar surface thereof, which method includes forming a first region of one type conductivity adjacent to said surface and forming two spaced ohmic contacts thereto, the improvement including steps for controllably establishing the value of said resistor comprising:
    forming said first region in a second region of said one type conductivity disposed adjacent to said surface, said second region having a lower impurity concentration than said first region, whereby the conductive path of said resistor is contained within the more-heavily-doped first region, and
    forming two additional regions of said opposite type conductivity respectively on opposite sides of said conductive path adjacent to both said surface and the junction between said first and said second regions, said additional regions having a higher impurity concentration and a greater depth than said first region and extending into said first region, whereby the width of said resistor, as measured along the perpendicular to said conductive path at various locations along said conductive path, is established by the extent of said additional regions into said first region.

2. A method as recited in claim 1 wherein said device is a monolithic integrated circuit device, wherein said method further includes forming a lateral transistor having spaced emitter and collector regions of said opposite type conductivity adjacent to said planar surface, said device further including circuit means electrically connected to said ohmic contacts and said emitter and said collector regions for connecting said resistor with said transistor to compensate for a variation in the base width of said transistor, and wherein the step of forming said additional regions and a step of forming said emitter and said collector regions of said transistor are performed simultaneously utilizing the same doping mask, whereby any variation in the base width of said transistor, as measured by the distance between said emitter and said collector regions, is made proportional to the variation in said width of said resistor.

3. A method of achieving a plurality of lateral transistors having similar base currents when subjected to identical operating potentials, each of said transistors being disposed adjacent to a planar surface of a separate monolithic integrated circuit device and having spaced emitter and collector regions of one type conductivity adjacent to said surface and a base width as measured by the distance between said emitter and said collector regions, comprising:
    forming in each of said devices a resistor including a first region of an opposite type conductivity adjacent to said surface and having a first and second ohmic contact thereto, the width of each of said resistors being formed simultaneously with said emitter and said collector regions of the lateral transistor disposed in said device therewith, and
    electrically connecting said resistor with said transistor in each of said devices by utilizing circuit means connected to said ohmic contacts and said emitter and said collector regions for connecting said resistor with said transistor to compensate for variations in base width in said lateral transistors, whereby similar base currents may be achieved.

4. A method as recited in claim 3 wherein said step of forming said resistor in each of said devices is performed by:
    forming said first region in a second region of said opposite type conductivity disposed adjacent to said surface, said second region having a lower impurity concentration than said first region, whereby the conductive path of said resistor is contained within the more-heavily-doped first region, and
    forming in each of said devices two additional regions of said one type conductivity respectively on opposite sides of said conductive path adjacent to both said surface and the junction between said first and said second regions, said additional regions having a higher impurity concentration and a greater depth than said first region and extending into said first region, whereby the width of each of said resistors, as measured along the perpendicular to said conductive path at various locations along said conductive path, is established by the extent of said additional regions into said first region, said additional regions being formed simultaneously in each of said devices with said emitter and said collector regions while utilizing the same doping mask, whereby the variation in base width of each of said transistors is made proportional to the variation in width of the resistor disposed in said device therewith.

5. A method as recited in claim 3 wherein said circuit means comprises:
    a first conductor connecting said first ohmic contact of said resistor to said emitter region, and
    a second conductor connecting said second ohmic contact of said resistor to said collector region.

* * * * *